(12) United States Patent
Kang

(10) Patent No.: US 6,278,650 B1
(45) Date of Patent: Aug. 21, 2001

(54) SEMICONDUCTOR MEMORY DEVICE CAPABLE OF KEEPING SENSING EFFICIENCY OF DATA LINE SENSE AMPLIFIER UNIFORM

(75) Inventor: Kyung-woo Kang, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/697,899

(22) Filed: Oct. 26, 2000

(30) Foreign Application Priority Data

Oct. 27, 1999 (KR) .................................................. 99-46908

(51) Int. Cl.$^7$ ...................................................... G11C 8/00

(52) U.S. Cl. ...................................... 365/230.03; 365/208

(58) Field of Search ............................... 365/230.03, 51, 365/63, 208, 207

(56) References Cited

U.S. PATENT DOCUMENTS 4,479,202 * 10/1984 Uchida .................................. 365/190

* cited by examiner

*Primary Examiner*—A. Zarabian
(74) *Attorney, Agent, or Firm*—Skjerven Morrill MacPherson LLP; David W. Heid

(57) ABSTRACT

A semiconductor memory device such as a DRAM maintains uniform sensing efficiency of a data line sense amplifier The memory device includes multiple memory blocks, and each memory block containing bit line sense amplifies, load transistors, and switching transistors. The load transistors generate a current on the data lines when the respective memory block is selected for a read operation. The switching transistors connect the respective bit line sense amplifiers to data line pairs. The sizes of the load and switching transistors can adjust for different distances along data lines between the respective bit line sense amplifiers and data line sense amplifiers. Accordingly, the data line sense amplifiers have uniform sensing efficiency regardless of the transmission distance.

8 Claims, 4 Drawing Sheets

SEMICONDUCTOR MEMORY DEVICE CAPABLE OF KEEPING SENSING EFFICIENCY OF DATA LINE SENSE AMPLIFIER UNIFORM

BACKGROUND OF THE INVENTION

A known architecture for a dynamic random access memory (DRAM) includes multiple memory blocks, where each memory block includes a set of bit line sense amplifiers. When a block is selected for a read operation, the bit line sense amplifiers in the block generate data signals by reading from one or more memory cells in the block. The sense amplifiers then output the data signals to data lines that are connected to data line sense amplifiers. More particularly, each sense amplifier conventionally outputs a pair of signals to a corresponding pair of data lines that are connected to a corresponding data line sense amplifier. The data line sense amplifiers typically include a current sense amplifying unit that senses a difference in currents on the pair of data lines. The sensed data on the data lines can be output from the data line sense amplifier and from the DRAM via data output buffers and multiplexing circuitry.

One problem with using current sensing on the data lines is that the transmission distances from the memory blocks to the data line sense amplifier vary. Accordingly, current from a memory block close to the data line sense amplifier travels a shorter length of the data lines and experiences less resistance on the data lines between the memory block and the data lines sense amplifier. Current from a memory block far away from the data line sense amplifier experiences more resistance on the data lines between that memory block and the data lines sense amplifier. Accordingly, the data line sense amplifier often has different sensing efficiency for different memory blocks. This can lead to differences in access times for read operations, which is particularly undesirable for a memory device such as a synchronous DRAM (SDRAM) where timing of data signals is critical. The problem becomes more significant for larger capacity memories because the relative differences in transmission lengths typically increase with an increase in the memory capacity and the integration density. Accordingly, a semiconductor memory device capable of keeping the sensing efficiency of a data line sense amplifier uniform is required.

SUMMARY OF THE INVENTION

In accordance with an aspect of the present invention, a semiconductor memory device keeps the sensing efficiency of a data line sense amplifier uniform. One embodiment of the invention is a semiconductor memory device having pairs of data lines that are shared by a plurality of memory blocks, each having a plurality of memory cells. The device includes load transistors that apply current to the pairs of data lines to which a bit line sense amplifier in the memory blocks transfers memory cell data, during reading. Data line sense amplifiers sense the current differences of the pairs of data lines. To maintain uniform sensing efficiency, the sizes of load transistors far away from the data line sense amplifiers are different from the sizes of load transistors close to the data line sense amplifiers. Preferably, the load transistors far away from the data line sense amplifiers are smaller than load transistors close to the data line sense amplifiers.

Additionally, the semiconductor memory device further includes switching transistors between the bit line sense amplifiers and the pairs of data lines. The switching transistors far away from the data line sense amplifiers can be larger than switching transistors close to the data line sense amplifiers. The switching transistors of different sizes can be use with or without load transistors that have different sizes.

According to an aspect of the present invention, the sensing efficiency of the data line sense amplifier can be kept uniform by differentiating the sizes of load transistors and/or switching transistors of the memory blocks according to the positions of the memory blocks.

BRIEF DESCRIPTION OF THE DRAWINGS

The advantages of the present invention will become more apparent by describing in detail an exemplary embodiment thereof with reference to the attached drawings in which.

DESCRIPTION OF THE PREFERRED EMBODIMENT

Figure 1:
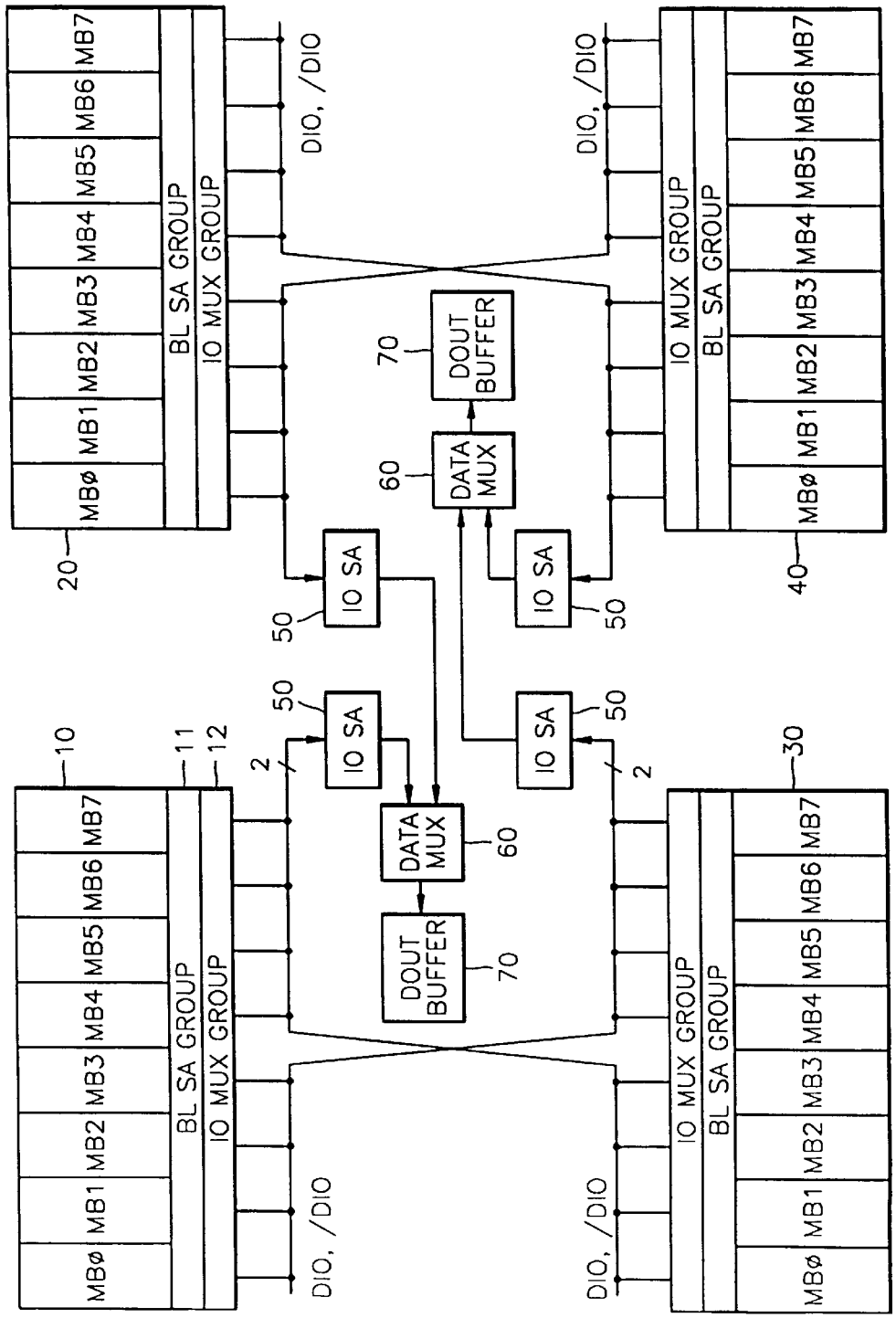
FIG. 1 is a block diagram schematically illustrating the internal blocks of a semiconductor memory device.

Hereinafter, the present invention is described by explaining an exemplary embodiment thereof with reference to the attached drawings. Like reference numerals in the drawings denote the same elements. The present invention particularly relates to SDRAMs, which have recently become widespread in use. Particularly, an SDRAM including four banks is described as an example in the present specification, but other embodiments of the invention include memory devices including devices having different numbers of banks depending on the capacity and architecture of a memory.

FIG. 1 is a basic block diagram of an SDRAM 2 in accordance with an exemplary embodiment of the invention. SDRAM 2 includes banks 10, 20, 30 and 40. Each bank 10, 20, 30, and 40 is divided into 8 memory blocks MB0, MB1, . . . , MB7. Data read from a selected memory block is transmitted to data lines DIO and /DIO via a bit line sense amplifier in a bit line sense amplifier group 11 and a multiplexer in an input-output multiplexer (IO MUX) group 12. Data line sense amplifiers 50 sense data transferred via the data lines DIO and /DIO. Data line multiplexer (DATA MUX) 60 selects from among the output signals of the data line sense amplifiers 50, which are connected to the banks 10, 20, 30 and 40, and transmits the selected output data signals to pads (not shown) via data output buffers 70.

Figure 2:
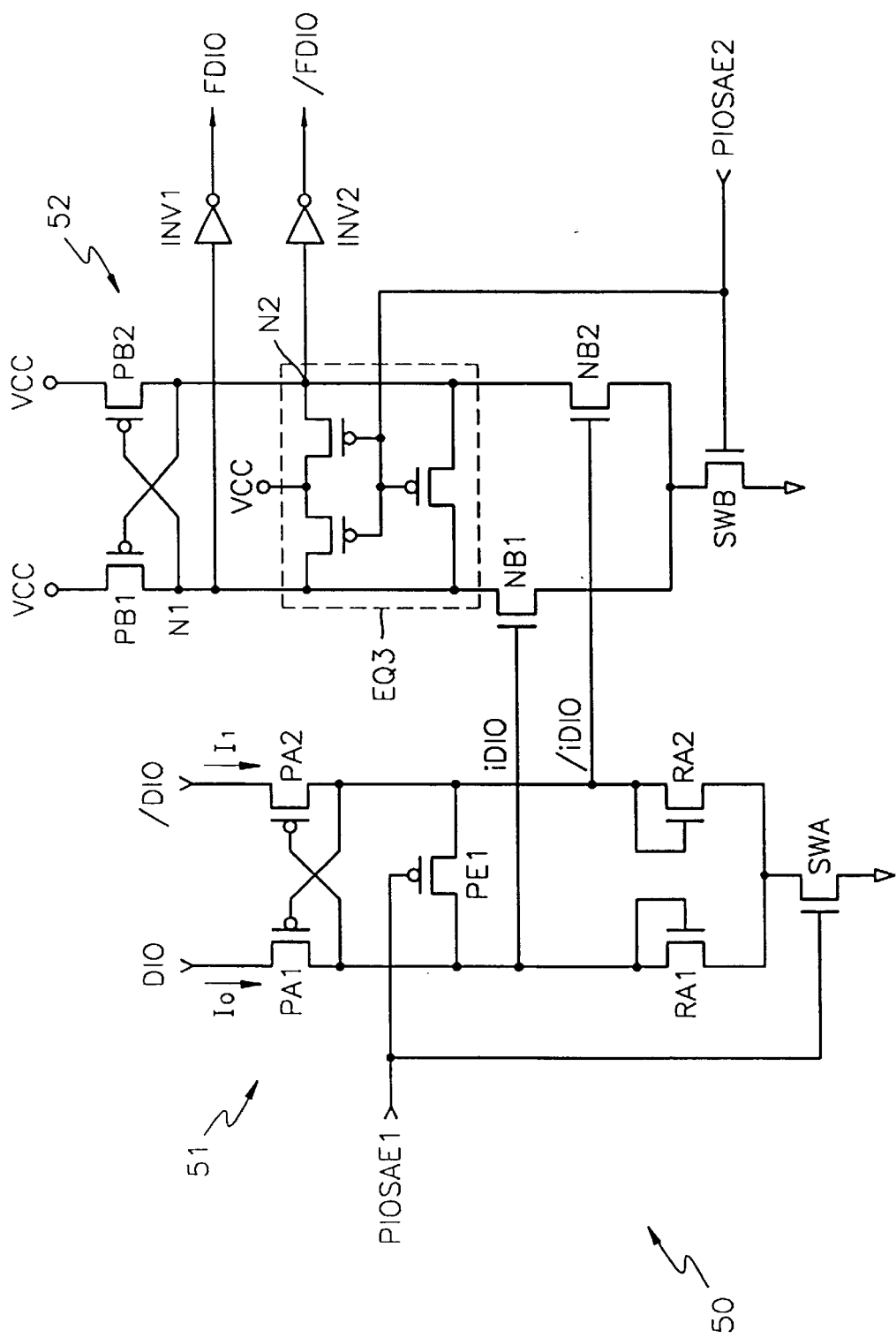
FIG. 2 is a circuit diagram illustrating a data line sense amplifier in FIG. 1.

FIG. 2 shows a data line sense amplifier 50, which is divided into a current sense amplification unit 51 and a latch sense amplification unit 52. The current and latch sense amplifying units 51 and 52 use different sensing methods. The current sense amplification unit 51 senses the current difference on a pair of data lines DIO and /DIO and consequently generates a potential difference between nodes iDIO and /iDIO depending on the current difference. The potential difference between the nodes iDIO and /iDIO generates logic levels, which the latch sense amplification unit 52 converts to fully swung to CMOS voltage levels. A larger potential difference of the nodes iDIO and /iDIO can increase the sensing efficiency in the latch sense amplification unit 52.

Referring to FIG. 1, at least two adjacent banks such as banks 10 and 30 or banks 20 and 40 share one of the data line sense amplifiers 50. Each shared data line sense amplifier 50 selectively senses and amplifies data signals on a pair of data lines DIO and /DIO for one of the banks 10 and 20 or one of the banks 30 and 40. Hereinafter, a data line sense amplifier 50 shared by the banks 10 and 30 will be described as an example. The number of data line sense amplifiers 50 depends on the number of pairs of data lines DIO and /DIO included in each memory bank. In the present specification, a single pair of data lines DIO and /DIO will be described for convenience of explanation.

Figure 3:
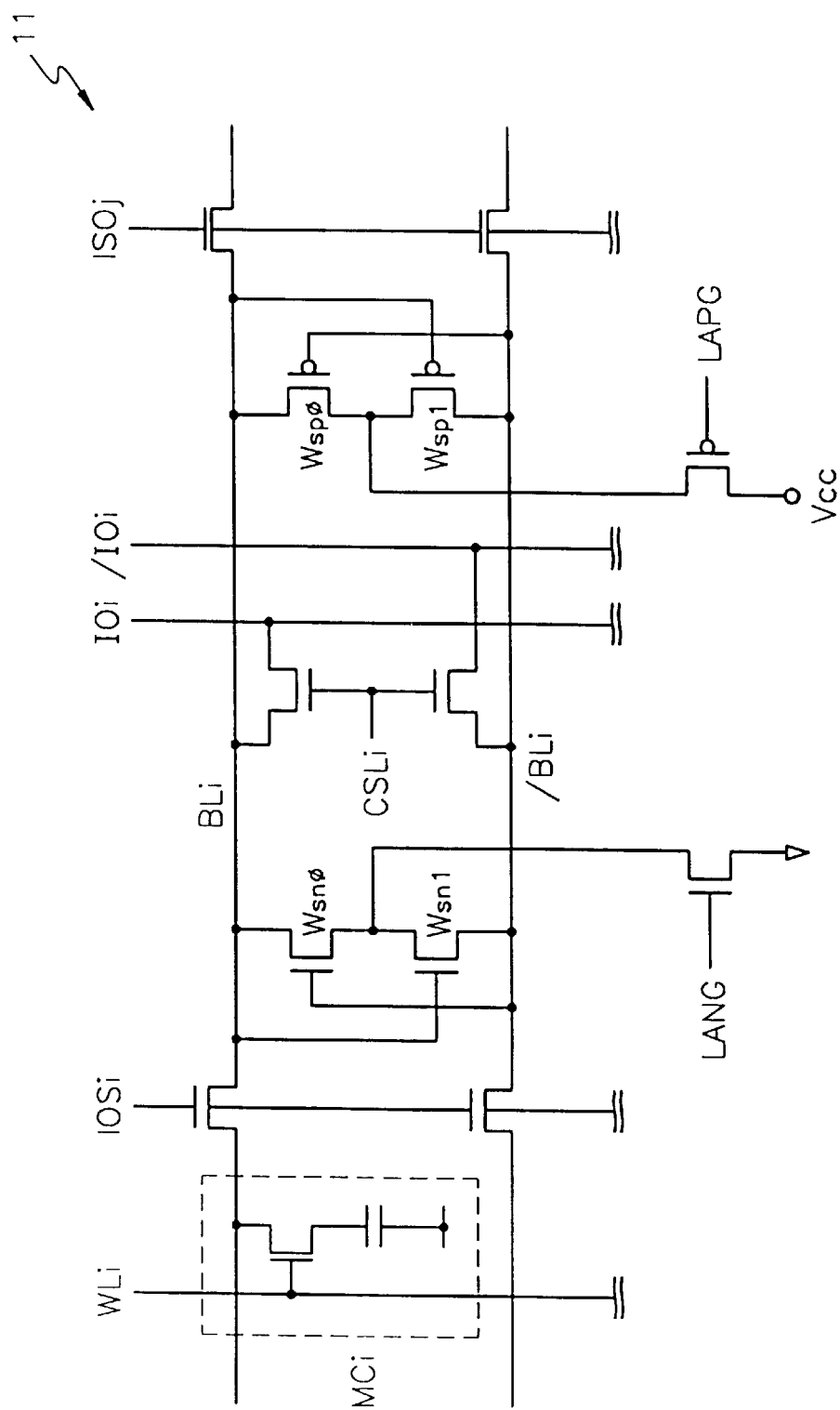
FIG. 3 is a circuit diagram of a bit line sense amplifier in the bit line sense amplifier group.

Each of the banks 10 and 30 contains multiple memory blocks MB0, MB1, . . . , MB7. In a manner similar to conventional DRAMs, the bit line sense amplifier group 11 and the IO MUX group 12 read and transfer memory cell data from each of the memory blocks MB0, MB, . . . , MB7 to the data lines DIO and /DIO. FIG. 3 shows a portion of the bit line sense amplifier group 11 in the exemplary embodiment of the present invention. The bit line sense amplifier group 11 of FIG. 3 senses the voltage levels of corresponding bit lines BLi and /BLi through the interaction between cross-coupled PMOS transistors Wsp0 and Wsp1 and cross-coupled NMOS transistors Wsn0 and Wsn1. When a word line WLi selects a memory cell MCi for a read operation, transistors Wsp0, Wsp1, Wsn0, and Wsn1 operate to amplify the voltage change that the memory cell MCi causes when connected to the bit line BLi. A column selection signal CSLi transfers the data signals from bit lines BLi and /BLIi to IO lines IOi and /IOi. Here, the configuration and operation of the bit line sense amplifier group 11, which is a general sense amplifier for sensing memory cell data, are well known in the art.

Figure 4:
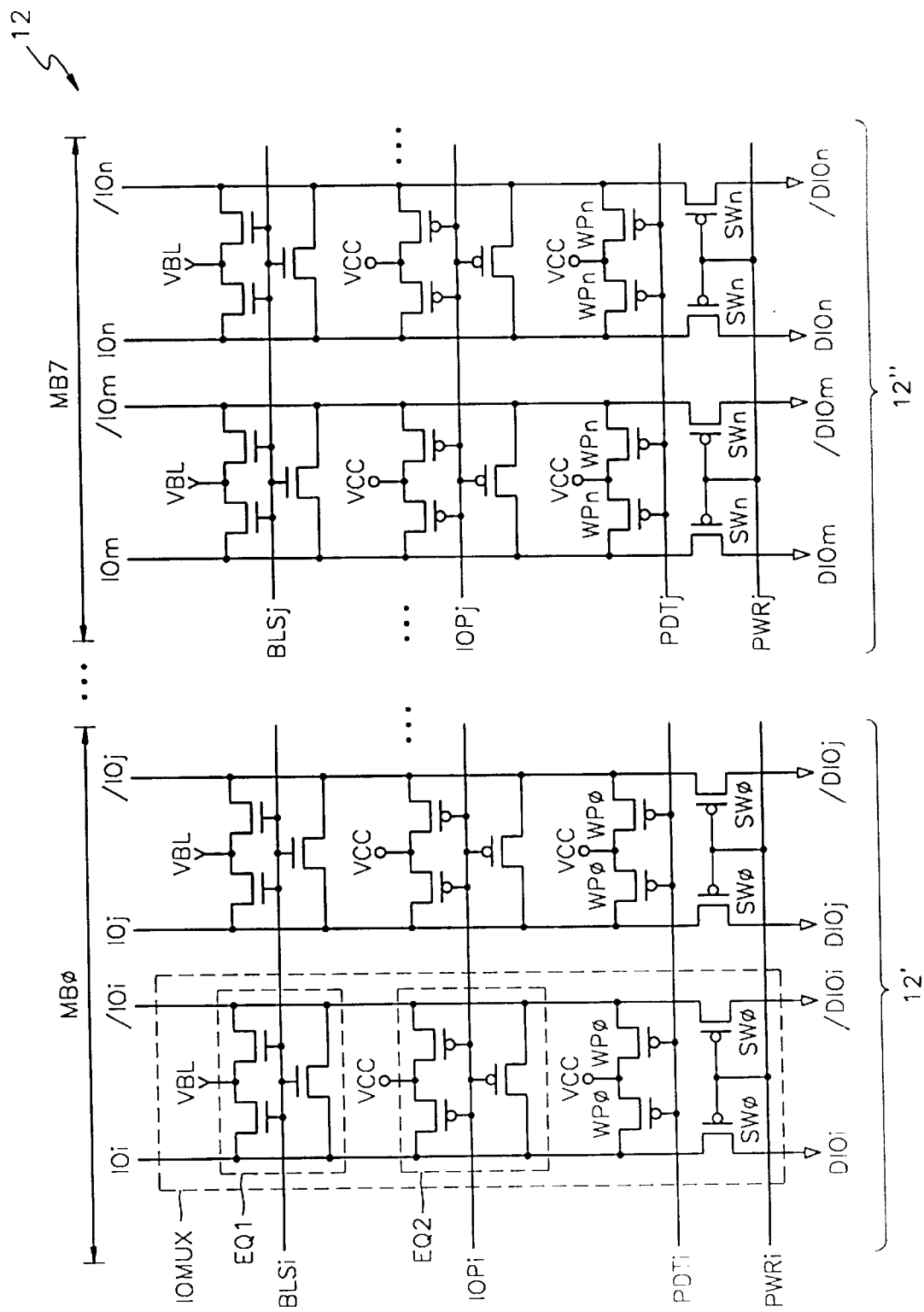
FIG. 4 is a circuit diagram illustrating the input-output line multiplexer group.

Referring to FIG. 4, IO lines IOi and /IOi, which receive memory cell data sensed by the bit line sense amplifier group 11 of FIG. 3 are connected to the IO MUX group 12. The IO lines can be precharged to a voltage level set in response to signals BLSi or IOPi for directing precharging the input output lines IOi and /IOi or supply a certain amount of current to the data line sense amplifier 50 to be described later. Such operation will now be described with respect to only section 12', which pertains to a memory block MB0, in the IO MUX group 12.

In the section 12', a first equalizer EQ1 equalizes a pair of input-output lines IOi and /IOi to a bit line voltage VBL in response to a block selection signal BLSi for selecting a memory block MB0. A second equalizer EQ2 equalizes the input-output lines IOi and /IOi to a power supply voltage VCC in response to an input-output line precharge signal IOPi. Switching transistors SWO, which control connection of the input-output lines IOi to /IOi to data lines DIOi and /DIOi, respond to a signal PWRI. In response to a data transmission signal PDTi, load transistors WP0 apply a constant amount of current to the data lines DIOi and /DIOi, which are connected to current sense amplification unit 51 (FIG. 2) in a data line sense amplifier 50. Here, the first equalizer EQ1 equalizes the input-output lines IOi and /IOi to the bit line voltage VBL in response to the logic high level of the block selection signal BLSi. This operation means non-selection of the memory block MB0 to which the input output lines IOi and /IOi pertain. On the other hand, the first equalizer EQ1 cancels the equalization of the input output lines IOi and /IOi in response to the logic low level of the block selection signal BLSi. This operation means selection of the memory block MB0 to which the input output lines IOi and /IOi pertain.

The second equalizer EQ2 equalizes the input-output lines IOi and /IOi to the power supply voltage VCC in response to the input-output line precharge signal IOPi, which is activated to a logic low level to achieve accurate data sensing upon reading, when switching from a writing operation in the selected memory block MB0 to a reading operation after a pause command such as a sudden interrupt is received.

The switching transistors SW0 turns on in response to a logic low level of signal PWRi upon reading, such that the input output lines IOi and /IOi are connected to the data lines DIOi and /DIOi. Thus, the data line sense amplifier 50 of FIG. 2 senses the read data transferred to the data lines DIOi and /DIOi. On the other hand, upon writing, the logic level of the write signal PWRi goes to a logic high level, so that the switching transistors SW0 are turned off. At this time, write data transferred to the data lines DIOi and /DIOi is stored in a selected memory cell MCi (see FIG. 3) via an input-output line driver (not shown).

The load transistors WP0 turns on in response to the data transmission signal PDTi, which is activated upon reading to apply a predetermined amount of current to the input output lines IOi and /IOi. The applied current serves as a current source for the current sense amplification unit 51 in the data line sense amplifier 50 of FIG. 2.

The data line sense amplifier 50 of FIG. 2, which the banks 10 and 30 share, selectively senses and amplifies data signals in the pair of data lines DIO and /DIO of the selected bank 10 or 30 in response to first and second sense amplification enable signals PIOSAE1 and PIOSAE2. The first and second sense amplification enable signals PIOSAE1 and PIOSAE2 are selectively activated when a memory device enters into a read mode. The data line sense amplifier 50 includes the current sense amplification unit 51 for sensing and amplifying a current level on the data lines DIO and /DIO, and the latch sense amplification unit 52 for sensing and amplifying the voltage level of the output iDIO and /iDIO of the current sense amplification unit 51.

As shown in FIG. 2, the current sense amplification unit 51 includes sensing transistors PA1 and PA2, load resistors RA1 and RA2 and a switching transistor SWA. The sensing transistors PA1 and PA2, which have the same electrical characteristics, have sources connected to respective data lines DIO and /DIO. The gate of the sensing transistor PA1 is connected to the drain of the sensing transistor PA2, and the drain of the sensing transistor PA1 is connected to the gate of the sensing transistor PA2. Also, the drains of the sensing transistor PA1 and PA2 are connected to the outputs iDIO and /iDIO, respectively. Load resistors RA1 and RA2 have the same electrical characteristics and in particular, have the same resistance. In response to the activation of the first sensing enable signal PIOSAE1, the switching transistor SWA provides a current path to ground for current from data lines DIO and /DIO including the current from the load transistor WP0 (FIG. 4) during reading.

When the bit line sense amplifier 11 of FIG. 3 transfers sensed memory cell data to the input-output lines IOi and /IOi during reading, the current sense amplification unit 51 senses different current amounts I0 and I1 on the data lines DIO and /DIO, respectively. That is, the gates of the sensing transistors PA1 and PA2 having the same voltage level in the early stage, but differences in the currents I0 and I1 flowing through sensing transistors PA1 and PA2 during reading data, changes the gate voltages of sensing transistors PA1 and PA2, which amplifies the current difference. The different current amounts I0 and I1 cause a voltage difference by flowing through the load resistors RA1 and RA2 to generate internal data signals iDIO and /iDIO.

The current sense amplification unit 51 further includes an equalization transistor PE1 for equalizing the data lines DIO and /DIO in response to the deactivation of the first sensing enable signal PIOSAE1. The equalization transistor PE1 stops a current sensing operation in cooperation with the switching transistor SWA, which is turned off in response to the deactivation of the first sensing enable signal PIOSAE1.

The outputs iDIO and /iDIO of the current sense amplification unit 51 are transmitted to the latch sense amplification unit 52, which senses the voltage levels of signals iDIO and /iDIO. The sensed voltage levels are voltage levels on nodes N1 and N2 and are high enough to be transmitted to peripheral circuits, that is, fully-swung CMOS voltage levels. The latch sense amplification unit 52 includes sensing transistors PB1 and PB2, driving transistors NB1 and NB2, a switching transistor SWB, and an equalizer EQ3. The driving transistors NB1 and NB2 respond to the signals iDIO and /iDIO of the current sense amplification unit 51. When a small amount of voltage difference is generated between nodes N1 and N2 due to the difference in the driving capability between the driving transistors NB1 and NB2, the sensing transistors PB1 and PB2 widen the voltage difference between nodes N1 and N2. At this time, the switching transistor SWB is turned on in response to the activation of the second sensing enable signal PIOSAE2, and the operation of the equalizer EQ3 is stopped. Thus, the voltage levels of the nodes N1 and N2 are transmitted to data bus lines FDIO and /FDIO via inverters INV1 and INV2.

Consequently, the data line sense amplifier 50 senses a current difference on the data lines DIO and /DIO caused by memory cell data sensed by the bit line sense amplification group 11 of FIG. 3. Hence, the voltage difference between the outputs of the current sense amplification unit 51 is sensed as a more complete voltage difference by the latch sense amplification unit 52.

However, the load transistors WP0 within the section 12' associated with memory block MB0, which is far away from the data line sense amplifier 50 of FIG. 1, are smaller than the load transistors WPn in a section 12" associated with a memory block MB7 close to the data line sense amplifier 50. The size difference overcomes the problem in which the sensing efficiency of sensing each of the memory blocks MB0, MB1, . . . , and MB7 is different due to the difference in the transmission lengths of data lines.

In other words, the load with respect to the memory block MB0 is greater than that with respect to the memory block MB7 from the view point of the data line sense amplifier 50. Accordingly, when the memory block MB0 transmits data to the data lines DIO and /DIO, a gate-source voltage difference of sensing transistors PA1 and PA2 in the current sense amplification unit 51 is reduced due to a voltage reduction caused by the load of the data lines DIO and /DIO. Therefore, the difference between currents I0 and I1 on the data lines DIO and /DIO is reduced, and the voltage difference between the outputs iDIO and /iDIO of the current sense amplification unit 51 is also reduced. To compensate for this reduction, the above diminishment in the size of the load transistors WP0 in the section 12' pertaining to the memory block MB0 reduces the amount of current which flows through the load transistors WP0, so that the voltage decrease due to the load on the data lines DIO and /DIO is reduced.

In the present invention, the sizes of the switching transistors SW0 through SWn in the input-output MUX group 12 can be differentiated, in addition to differentiating the sizes of the switching transistors WP therein. That is, the switching transistors SW0 in the section 12', which pertains to the memory block MB0 far from the data line sense amplifier 50 of FIG. 1, can be designed to be larger than the switching transistors SWn in the section 12", which pertains to the memory block MB7 close thereto. Thus, a current from the load transistors WP0 is conducted to data lines DIO and /DIO better than current from the load transistors WPn.

Therefore, the sensing efficiency in the data line sense amplifier 50 is kept uniform by using different sizes of load transistors WP0 and WPn and the switching transistors SW0 and SWn within the IO MUX group 12. More particularly the sizes of load and switching transistors connected to corresponding memory blocks can be selected according to the position of a memory block relative to a data line sense amplifier.

Although the invention has been described with reference to a particular embodiment, it will be apparent to one of ordinary skill in the art that modifications of the described embodiment may be made without departing from the spirit and scope of the invention.

What is claimed is:

1. A semiconductor memory device having a pair of data lines shared by a plurality of memory blocks, comprising:
   bit line sense amplifiers connected to the pair of data lines, each bit line sense amplifier being associated with and connected to read memory cells in a corresponding memory block;
   load transistors connected to apply current to the pair of data lines, each load transistor being associated with a corresponding memory block and applying a current to the pair of data lines during reading from the associated memory block; and
   a data line sense amplifier connected to sense a current difference for the data lines in the pair,
   wherein the load transistors associated with memory blocks far away from the data line sense amplifier have sizes that differ from sizes of the load transistors associated with memory blocks close to the data line sense amplifier.

2. The semiconductor memory device of claim 1, wherein the load transistors associated with the memory blocks far away from the data line sense amplifier are smaller than the load transistors associated with the memory blocks close to the data line sense amplifier.

3. The semiconductor memory device of claim 1, further comprising switching transistors between the bit line sense amplifiers and the pair of data lines, wherein switching transistors far from the data line sense amplifier are larger than switching transistors close to the data line sense amplifier.

4. The semiconductor memory device of claim 1, wherein the data line sense amplifier comprises a latch sense amplification unit that amplifies a voltage difference, which was generated from the current difference, to a voltage level required for peripheral circuits.

5. A semiconductor memory device having a plurality of banks, comprising:
   pairs of data lines included in each of the banks;
   load transistors connected to apply currents to the pairs of data lines, to which data sensed by bit line sense amplifiers within a selected bank is transferred; and
   data line sense amplifiers shared by at least two adjacent banks, for sensing the current differences for respective pairs of the data lines, wherein the load transistors far away from the data line sense amplifiers have sizes that are different from sizes of the load transistors close to the data line sense amplifiers.

6. The semiconductor memory device of claim 5, wherein the load transistors far away from the data line sense amplifiers are smaller than the load transistors close to the data line sense amplifiers.

7. The semiconductor memory device of claim 5, further comprising switching transistors between the bit line sense amplifiers and the pairs of data lines, wherein switching transistors far away from the data line sense amplifiers are larger than switching transistors close to the data line sense amplifiers.

8. The semiconductor memory device of claim 5, wherein each of the data line sense amplifiers comprises a latch sense amplification unit that amplifies a voltage difference, which was generated from the sensed current difference, to a voltage level which is enough to be transmitted to peripheral circuits.

* * * * *